(12) United States Patent
Koike et al.

(10) Patent No.: US 7,885,124 B2
(45) Date of Patent: *Feb. 8, 2011

(54) SEMICONDUCTOR STORAGE DEVICE

(75) Inventors: Tsuyoshi Koike, Kyoto (JP); Yuichirou Ikeda, Kyoto (JP); Akira Masuo, Kyoto (JP)

(73) Assignee: Panasonic Corporation, Osaka (JP)

( * ) Notice: Subject to any disclaimer, the term of this patent is extended or adjusted under 35 U.S.C. 154(b) by 125 days.

This patent is subject to a terminal disclaimer.

(21) Appl. No.: 12/203,431

(22) Filed: Sep. 3, 2008

(65) Prior Publication Data

US 2009/0067265 A1 Mar. 12, 2009

(30) Foreign Application Priority Data

Sep. 10, 2007 (JP) .............................. 2007-234114

(51) Int. Cl.
*G11C 7/00* (2006.01)

(52) U.S. Cl. ............................ 365/189.11; 365/189.21; 365/203; 365/205; 365/210

(58) Field of Classification Search ....................... None
See application file for complete search history.

(56) References Cited

U.S. PATENT DOCUMENTS 3,961,326 A 6/1976 Craven 6,822,907 B2 * 11/2004 Maruyama et al. ..... 365/185.21
6,831,871 B2    12/2004 Khellah et al.
6,891,767 B2     5/2005 Chun et al.
6,982,899 B2     1/2006 Sumitani et al.
2007/0091703 A1 * 4/2007 Nishimura et al. .......... 365/212

FOREIGN PATENT DOCUMENTS

JP    64-054756     3/1989
JP    06-068672     3/1994
JP    07-254281    10/1995
JP    2004-079075   3/2004
JP    2004-220652   8/2004
JP    2007-058979   3/2007

OTHER PUBLICATIONS

Khellah, Muhammad et al. "Wordline & Bitline Pulsing Schemes for Improving SRAM Cell Stability in Low-Vcc 65nm CMOS Designs," 2006 Symposium on VLSI Circuits Digest of Technical Papers.

* cited by examiner

*Primary Examiner*—Hoai V Ho
*Assistant Examiner*—James G Norman
(74) *Attorney, Agent, or Firm*—McDermott Will & Emery LLP

(57) ABSTRACT

A precharge circuit steps up a voltage of a bit line connected to a memory cell to a power supply voltage. A plurality of step-down circuits step down the voltage of the bit line to a voltage level lower than the power supply voltage before data is read from the memory cell. The plurality of step-down circuits are connected to the bit line, and the plurality of step-down circuits are controlled by step-down control signals different to each other.

16 Claims, 15 Drawing Sheets

F I G. 1
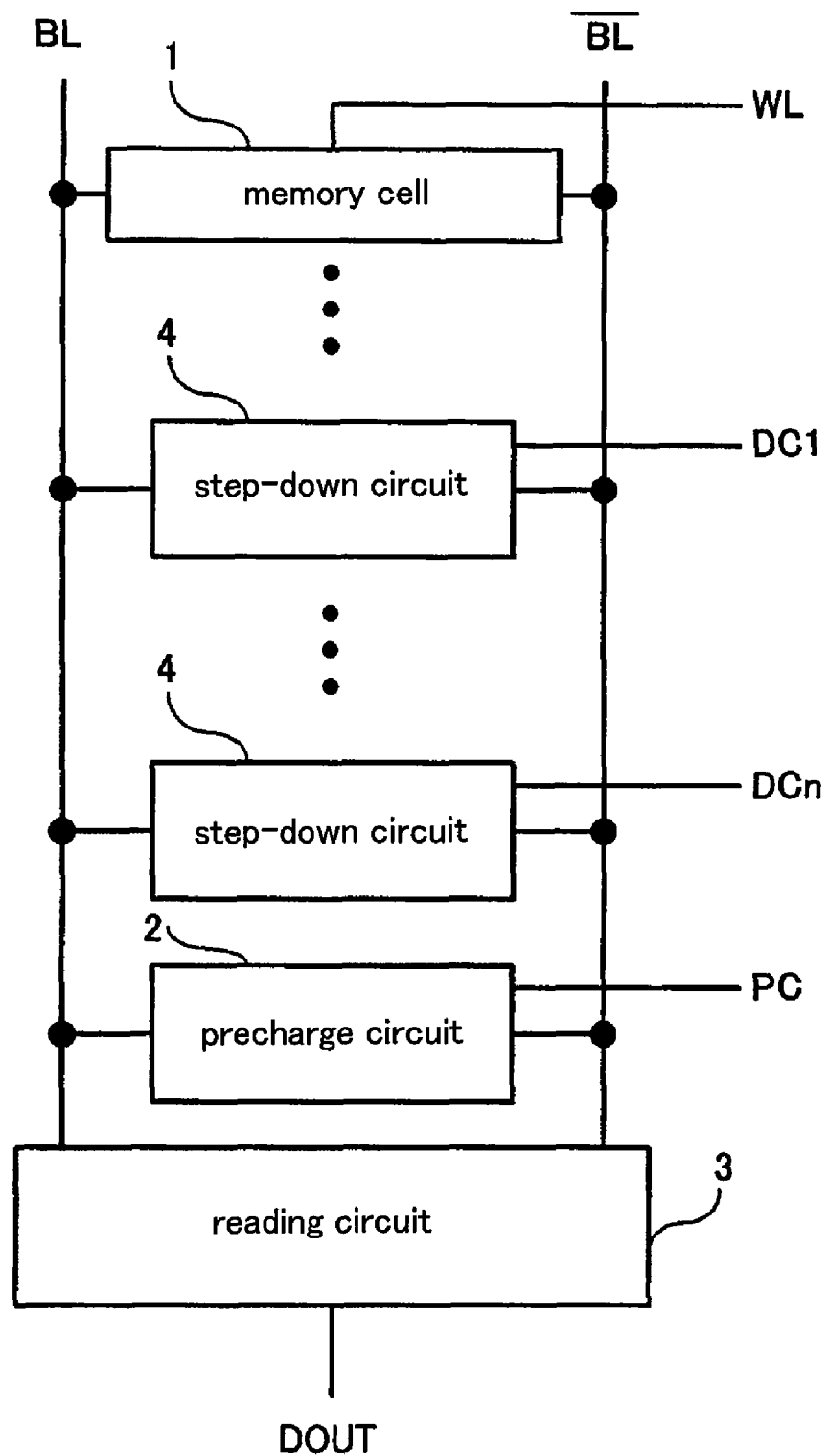

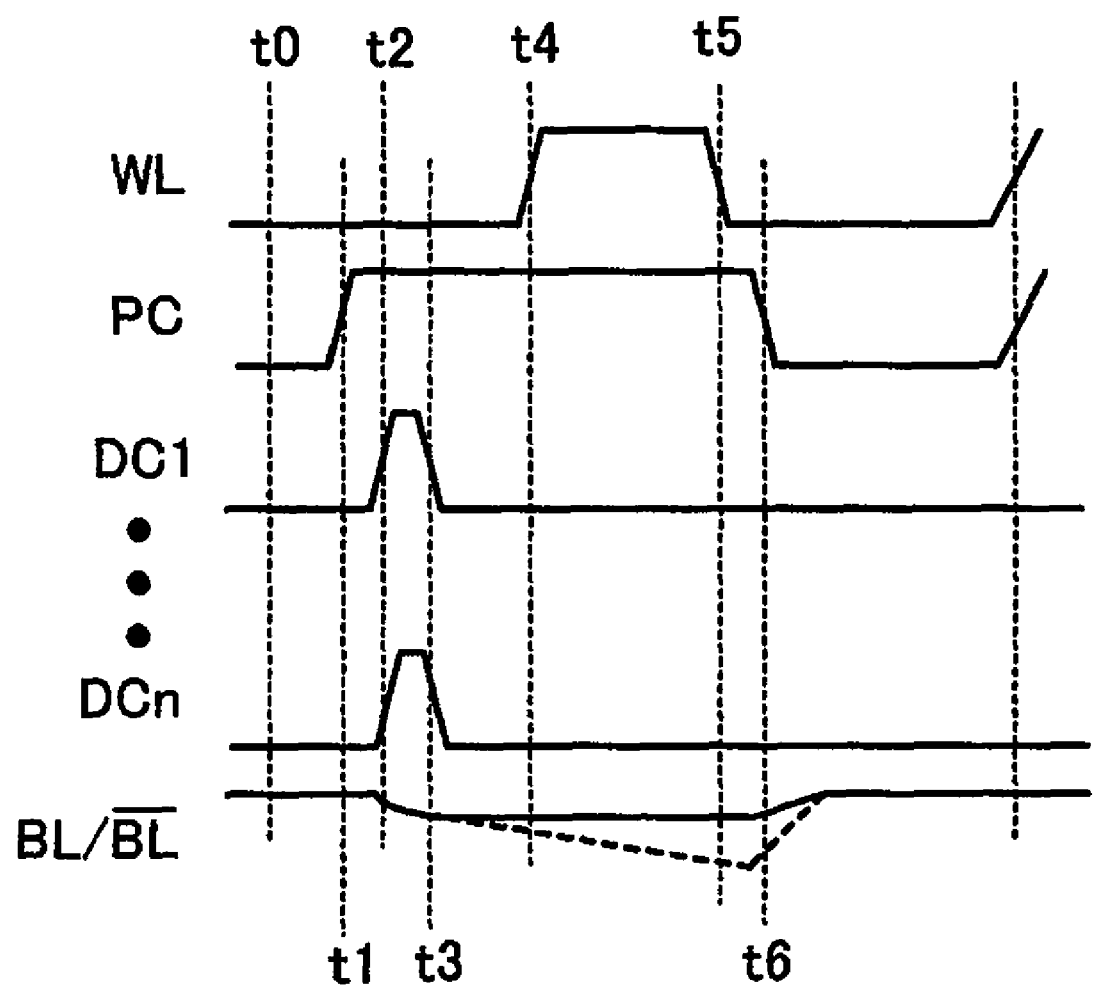
F I G. 3

F I G. 6
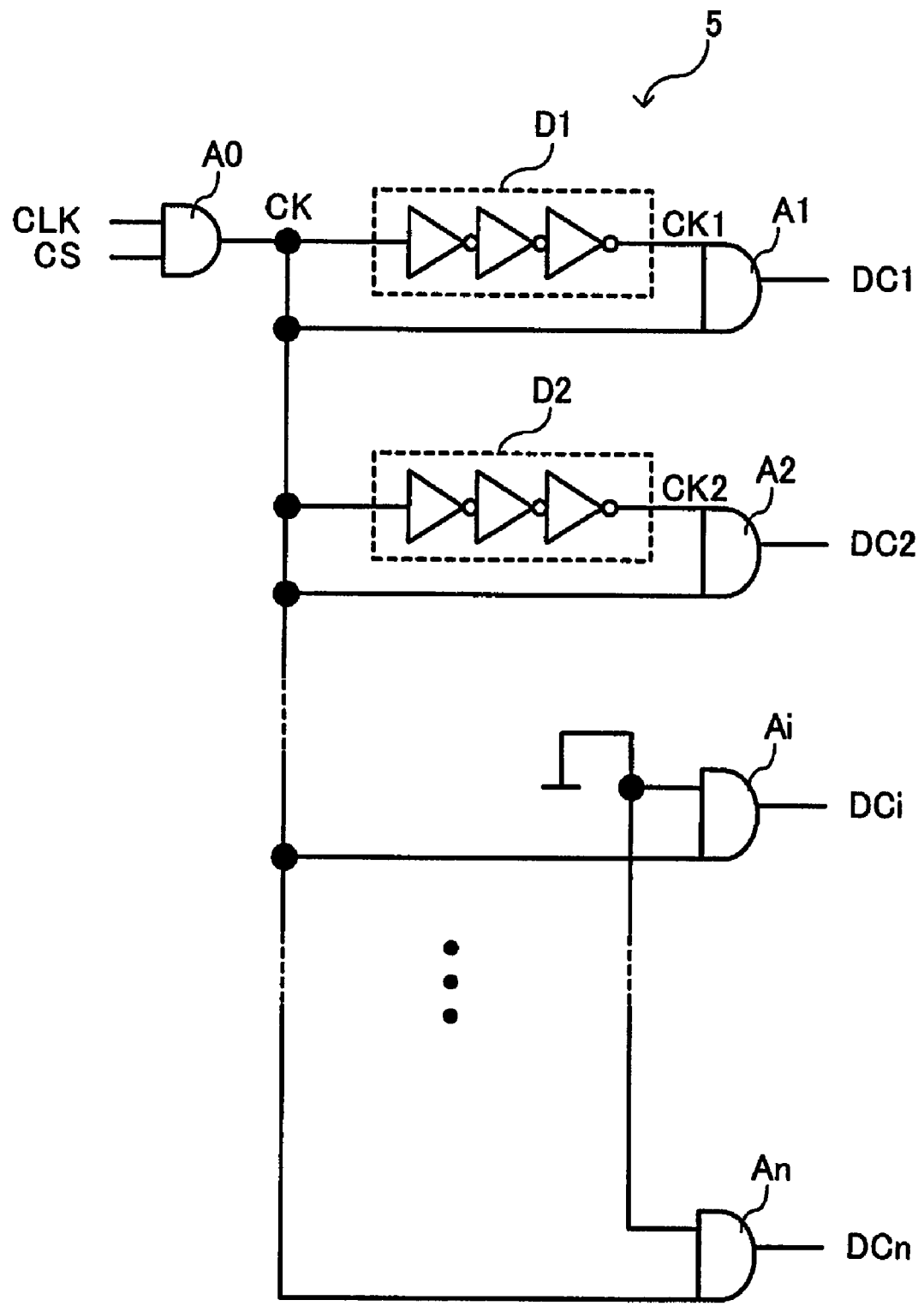

F I G. 7
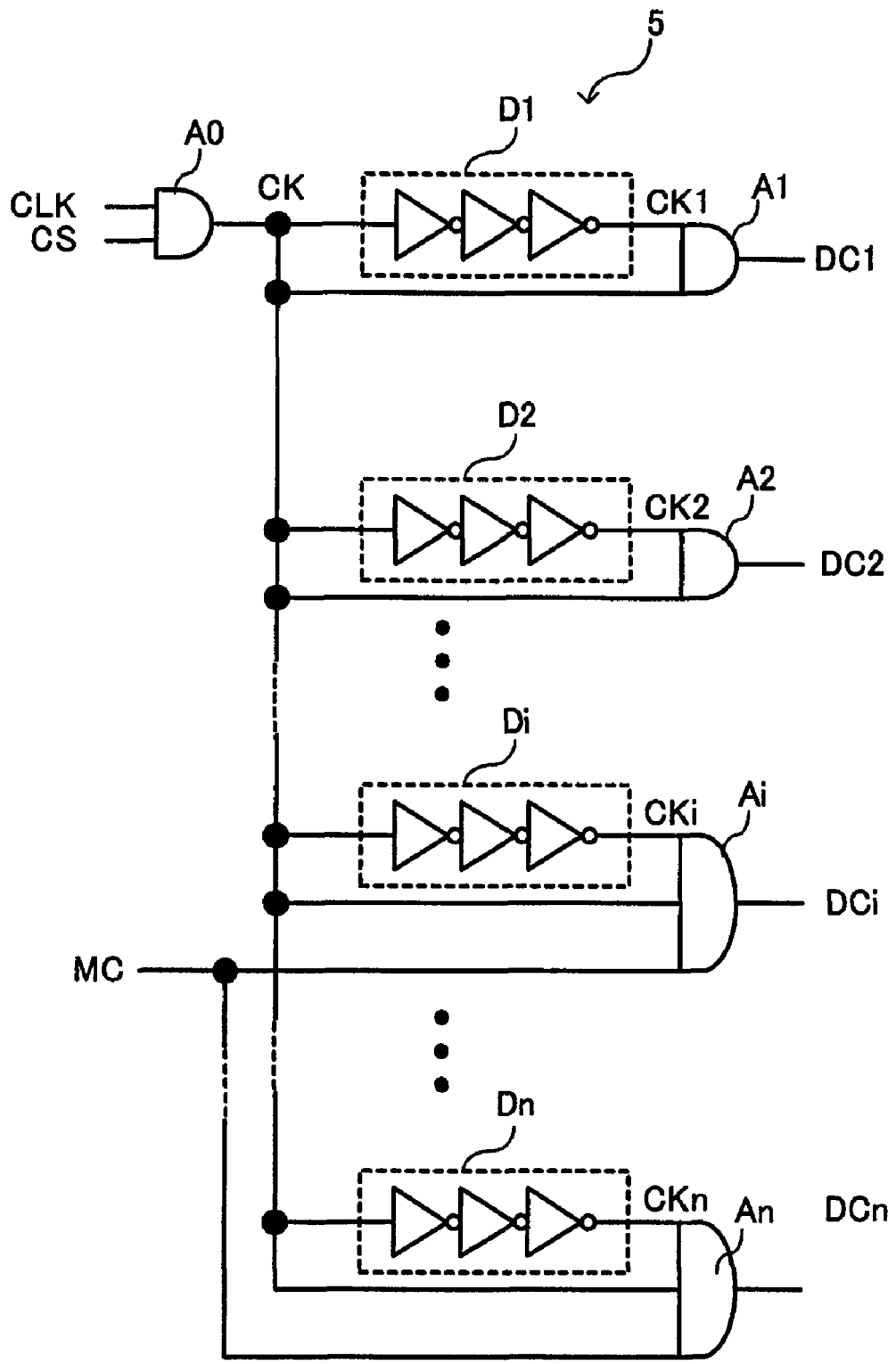

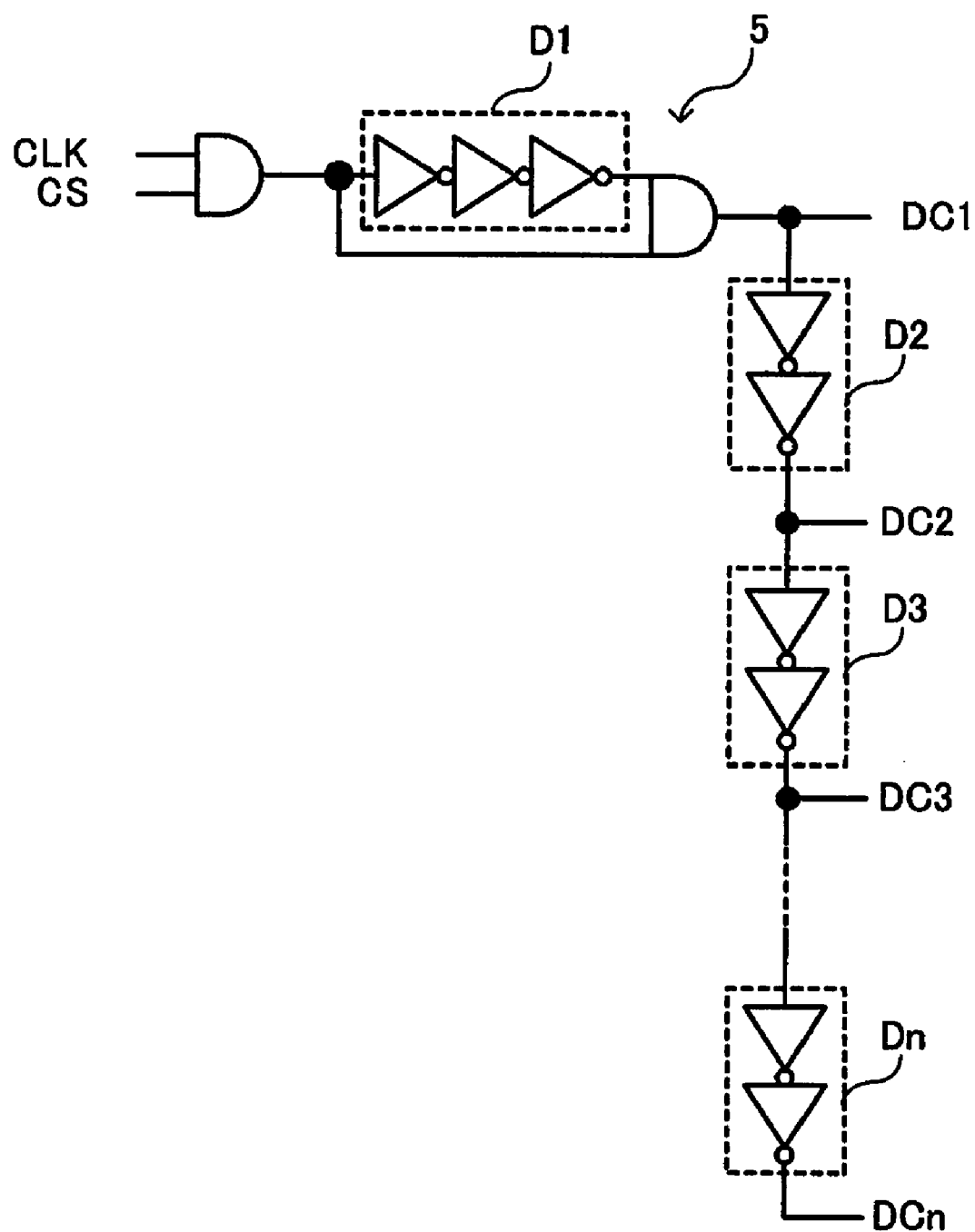
F I G. 8

SEMICONDUCTOR STORAGE DEVICE

BACKGROUND OF THE INVENTION

1. Field of the Invention

The present invention relates to a semiconductor storage device comprising a memory cell, a bit line connected to the memory cell, a precharge circuit which steps up a voltage of the bit line to a power supply voltage, and a step-down circuit which steps down the voltage of the bit line to a voltage level lower than the power supply voltage before data is read from the memory cell.

2. Description of the Related Art

In the field of a semiconductor storage device, there is technology, which is conventionally available, for improving a data reading speed by stepping down a bit line precharged with a power supply voltage to a voltage level lower than the power supply voltage before data is read and thereby shortening a time required for a change in the voltage of the bit line from the power supply voltage level to a ground level. The change in the voltage of the bit line from the power supply voltage level to the ground level is detected by a PMO transistor at a subsequent gate. However, when a step-down level in the bit line is below an operation region of a transistor for detection, through current and a data-read error are thereby caused. Data-read errors also occur in the case where a sense amplifier or a PMOS cross driver is connected to the bit line. Therefore, it is necessary to set a step-down level of the bit line at around a threshold voltage of the PMOS transistor.

In a SRAM circuit where the bit line is precharged with the power supply voltage, charges of the power supply voltage level of the bit line flow into a node at which "L" data of SRAM is retained upon the activation of a word line in a non-selected column used for the data reading or writing operations. The inflow of too many charges results in the generation of a data-write error. An indicator called the static noise margin is used to show a level of resistance against data-write errors. The static noise margin has been reduced in recent years as the semiconductor is increasingly miniaturized, and consequently data-write errors are more likely to occur. In order to respond to the recent trend, there is a conventional technology wherein a potential of the power supply voltage level of the bit line is stepped down so as to reduce the current flow into the node of the memory cell at which "L" data is stored, such flow taking place when the word line is activated. When the voltage step-down level in the bit line is not enough, a data-write error occurs due to the reason described above. When the voltage step-down level in the bit line is too high, a data-write error is caused by charges of "L" level of the bit line which flow into the node of the SRAM at which "H" data of the SRAM is retained. Therefore, it is necessary to step down the voltage of the bit line to such a voltage level that can assure the static noise margin.

Below is described a technology for stepping down the voltage of the bit line in a conventional semiconductor storage device referring to FIGS. 15A and 15B. FIG. 15A is a circuit diagram illustrating a constitution of a conventional semiconductor storage device, and FIG. 15B is a timing chart illustrating an operation of the semiconductor storage device. In FIG. 15A, 11 denotes a SRAM memory cell, 12 denotes a precharge circuit, 13 denotes a reading circuit, 14 denotes a step-down circuit, BL and /BL are complementary bit lines, WL denotes a word line, PC denotes a precharge control signal, DC denotes a step-down control signal, QP51, QP52 and QP53 denote PMOS transistors constituting the precharge circuit 12, QN51 and QN52 denote NMOS transistors constituting the step-down circuit 14, QP54 denotes a PMOS transistor, and Inv denotes an inverter.

The step-down circuit 14 is additionally provided in order to step-down voltages of the bit lines BL and /BL prior to the activation of the word line WL. Sources of the step-down transistors QN51 and QN52 are connected to the ground, drains thereof are directly connected to the bit lines BL and /BL, and gates thereof are connected to a gate of the equalizing transistor QP54 via the inverter Inv. The gates of the step-down transistors QN51 and QN52 are driven by the step-down control signal DC.

As shown in FIG. 15B, prior to the activation of the word line WL, the precharge control signal PC is negated and thereby turns to "H" level at a timing t51, the precharge transistors QP51 and QP52 and the equalizing transistor QP53 are turned off, which leaves the bit lines BL and /BL in a floating state.

At a timing t52, the step-down control signal DC is asserted and thereby turns to "H" level, and the step-down transistors QN51 and QN52 in the step-down circuit 14 are turned on. Further, the equalizing transistor QP54 is turned on, charges of the bit line BL and /BL are then discharged, and potentials of the bit lines BL and /BL are stepped down to a predetermined voltage level. A possible example of the predetermined voltage level is VDD-Vth. VDD is a power supply voltage used for the precharge, and Vth is a threshold voltage of the MOS transistors.

When the step-down control signal DC is negated and thereby turns to "IL" level at a timing t53, the step-down transistors QN51 and QN52 are turned off, and the equalizing transistor QP54 is turned off. As a result, the step-down and equalizing operations for the bit lines BL and /BL are halted.

At a timing t54, the word line WL is asserted, and data is read from the memory cell 11. In the case where "0" is stored in the memory cell 11, current flows from the bit line BL into the memory cell 11, and the potential of the bit line BL is lowered; however, the potential of the complementary bit line /BL is not stepped down. The bit line BL="L" level and the complementary bit line /BL="H" level are judged by the reading circuit 14 as "0" data. In the case where "1" is stored in the memory cell 11, current flows from the complementary bit line /BL into the memory cell 11, and the potential of the complementary bit line /BL is lowered; however, the potential of the bit line BL is not stepped down. The bit line BL="H" level and the complementary bit line /BL="L" level are judged by the reading circuit 14 as "1" data. Broken lines denoting the potentials of the bit lines BL and /BL shown in FIG. 15B illustrate potential reduction irrespective of whether the potential reduction occurs at the bit line BL or the complementary bit line /BL.

At a timing t55, the word line WL is at "L" level, and the data reading operation is terminated. At a timing t56, the precharge control signal PC is asserted and thereby turns to "L" level, and the precharge transistors QP51 and QP52 and the equalizing transistor QP53 are turned on. Then, the bit lines BL and /BL are precharged with the power supply voltage.

In the foregoing description, the step-down levels of the bit lines BL and /BL are adjusted in accordance with a pulse width of the step-down control signal DC. Provided that the step-down level is $\Delta V$, and the pulse width of the step-down control signal DC is Tw, $\Delta V \propto Tw$, which means that the step-down level $\Delta V$ is substantially in proportion with the pulse width Tw of the step-down control signal DC.

In general, the voltages of the bit lines BL and /BL are stepped down prior to the activation of the word line WL in an initial stage of an operation cycle. The word line WL is activated shortly after the operation cycle starts. Therefore, the step-down transistors QN51 and QN52 are controlled by the step-down control signal DC having a fine pulse width. In the foregoing conventional technology, the step-down level ΔV in the bit lines BL and /BL are decided in a sensitive manner by the pulse width Tw of the step-down control signal DC inputted to the step-down transistors QN51 and QN52. Therefore, when the pulse width Tw of the step-down control signal DC changes depending on operation conditions and device variability, the step-down level ΔV varries significantly, which results in a malfunction.

SUMMARY OF THE INVENTION

Therefore, a main object of the present invention is to provide a semiconductor storage device capable of controlling variability in a step-down level of a bit line irrespective of operation conditions and device variability and preventing malfunctions in data reading and writing operations.

In order to achieve the foregoing object, a semiconductor storage device according to the present invention comprises
 a memory cell;
 a bit line connected to the memory cell;
 a precharge circuit for stepping up a voltage of the bit line to a power supply voltage; and
 a plurality of step-down circuits for stepping down the voltage of the bit line to a voltage level lower than the power supply voltage before data is read from the memory cell, wherein
 the plurality of step-down circuits are connected to the bit line, and the plurality of step-down circuits are controlled by step-down control signals different to each other.

The present invention thus constituted works as follows. In the case where a single step-down circuit is provided, there is only one step-down control signal corresponding thereto. Then, when a pulse width of the step-down control signal changes due to operation conditions and device variability, a step-down level in the bit line is directly affected by the change. In the present invention, in order to avoid the inconvenience, a plurality of step-down circuits are provided and connected to the bit line. In the case where the plurality of step-down circuits are provided, a single step-down control signal common to the plurality of step-down circuits may be used, or a plurality of step-down control signals different to each other may be used for the plurality of step-down circuits. The constitution according to the present invention adopts the latter case.

In the case where a single step-down control signal which can be shared by the plurality of step-down circuits is used, when the pulse width of the single step-down control signal is changed due to the operation conditions and device variability, the influence directly acts on all of the step-down circuits. When the pulse width of the single step-down control signal is reduced, an amount of time consumed for the step-down operation is proportionally reduced in all of the step-down circuits. More specifically, when the pulse width is reduced by k percentages, the step-down level is reduced by k percentages equally in all of the step-down circuits. When the pulse width of the single step-down control signal is increased, the amount of time consumed for the step-down operation is proportionally increased in all of the step-down circuits. More specifically, when the pulse width is increased by k percentages, the step-down level is increased by k percentages equally in all of the step-down circuits. In the case where only one single step-down control signal is shared by the plurality of step-down circuits, therefore, there is no substantive change in comparison to the conventional technology wherein a single step-down circuit is provided.

In the present invention, wherein different step-down control signals are used for the plurality of step-down circuits, the pulse width of a step-down control signal, in the plurality of step-down control signals, changes by $(k-\alpha_1)$ percentages, the pulse width of another step-down control signal changes by $(k-\alpha_2)$ percentages, the pulse width of still another step-down control signal changes by $(k+\alpha_3)$ percentages, and the pulse width of still another step-down control signal changes by $(k+\alpha_4)$ percentages depending on the operation conditions and device variability. Thus, the pulse width changes toward both of the plus and minus sides. $\alpha_1, \alpha_2, \alpha_3$ and $\alpha_4$ are positive real numbers, and $\alpha_1 \neq \alpha_2$, and $\alpha_3 \neq \alpha_4$. In brief, the pulse widths of the plurality of step-down control signals are different to one another. Accordingly, the step-down operation time is different in each of the plurality of step-down circuits. In other words, a timing of terminating the step-down operation is different in each of the plurality of step-down circuits, and the respective step-down operations are terminated in steps. As a result, variability of the step-down level in the bit line can be effectively controlled in comparison to the case where the plurality of step-down circuits are controlled by a single step-down control signal.

In the present invention, the pulse widths of at least a part of the plurality of step-down control signals may be different to each other. The step-down circuit which is controlled by the step-down control signal in which the pulse width is short terminates the step-down operation sooner. The step-down circuit which is controlled by the step-down control signal in which the pulse width is long terminates the step-down operation rather late. Assuming that the plurality of step-down control signals are substantially synchronously asserted, since all of the step-down circuits are under operation conditions in an initial stage of the step-down operation, the step-down speed in the bit line is fast. Then, the step-down control signal in which the pulse width is short changes to negate state and the operation of the corresponding step-down circuit is halted, and only the step-down circuits controlled by the step-down control signals in which the pulse width is long are under operating condition. As a result, the step-down speed in the bit line is slowed down. In other words, the step-down level speedily approaches a targeted step-down level in the initial state, and then starts to slowly approach the targeted step-down level. As a result, the step-down level is not largely shifted from the targeted level, and the variability of the step-down level in the bit line can be lessened.

In the present invention, at least apart of the plurality of step-down control signals can be fixed in an active state. Thus constituted, the step-down control signals which are fixed in an active state are adjusted based on a measurement result of TEG (Test Element Group) or the like. As a result, a capacity of the step-down operation can be adjusted.

In the present invention, at least a part of the plurality of step-down control signals can be activated or inactivated by a mode control signal. Thus constituted, a part of the step-down circuits can be activated or inactivated when the mode control signal is switched. As a result, the step-down level can be dynamically adjusted during an operation cycle.

In the present invention, the pulse widths may be substantively equal to each other, and assert and negate timings may be different in the plurality of step-down control signals. Thus constituted, when the operation timings of the plurality of step-down circuits are shifted while the number of the step-down circuits under operating conditions is adjusted, a drastic voltage drop resulting from the step-down operation can be controlled.

In the present invention, the plurality of step-down circuits may be connected to the bit line via a switching element whose on and off are controlled by a step-down start control signal. Thus constituted, the present invention further works as follows. In the case where each of the plurality of step-down circuits is directly connected to the bit line, a capacitance formed in the bit line will be too large for an operation speed to be increased. In the suggested constitution wherein only the switching element is directly connected to the bit line, the capacitance formed in the bit line can be reduced. As a result, the deterioration of the operation speed can be prevented.

In the present invention, the plurality of step-down circuits may be shared by a plurality of bit lines. Accordingly, a circuit area can be reduced.

In the present invention, at least two of the plurality of step-down circuits may have a step-down capacity which is different to that of the other step-down circuits. Accordingly, the present invention further works as follows. The step-down level during a certain duration is large in the step-down circuit having a high step-down capacity, while the step-down level during a certain duration is small in the step-down circuit having a low step-down capacity. Therefore, when the plurality of step-down circuits respectively having different step-down capacities are simultaneously operated, the overall step-down level is the sum of the step-down levels of the respective step-down circuits. For comparison, it is assumed that all of the step-down circuits have a step-down capacity P, and the number of the step-down circuits is three. The summed step-down capacities of the three step-down circuits are P+P+P=3·P, which is an integral multiple. Provided that the plurality of step-down circuits have different step-down capacities P, (½)P, and (¼)P. The summed step-down capacities of the three step-down circuits in this case are P+(½)P+(¼)P=1.75·P. Thus, a power including a fractional portion is obtained in place of an integral multiple. Accordingly, the step-down operation is weighted processing. As is clearly learnt from this, when the plurality of step-down circuits having different step-down capacities are used, the step-down level in the bit line can be more finely and accurately adjusted.

A semiconductor storage device according to the present invention may be constituted as follows. The semiconductor storage device according to the present invention comprises a plurality of memory cells;

a bit line to which the plurality of memory cells are connected;

a precharge circuit for stepping up a voltage of the bit line to a power supply voltage; and a plurality of step-down circuits for stepping down the voltage of the bit line to a voltage level lower than the power supply voltage before data is read from any of the plurality of memory cells, wherein the plurality of step-down circuits are connected to the bit line, and the plurality of step-down circuits are equally spaced and then connected to the bit line.

According to the foregoing constitution, in the case where the step-down control signals having the same timing are used for the plurality of step-down circuits, the plurality of step-down circuits are equally spaced and then connected to the bit line. As a result, the variability in the step-down level caused depending on the positions of the step-down circuits in the bit lines can be controlled.

In a modified embodiment of the present invention, a plurality of bit lines are provided in parallel with each other, and constitute a plurality of groups of bit lines provided separately from each other, and the plurality of step-down circuits are provided in the respective groups of the bit lines and connected to the bit line constituting the corresponding group of bit lines. According to the constitution, the variability of the step-down level caused depending on the positions of the step-down circuits in the bit lines can be lessened.

In the present invention, the step-down circuits may be respectively provided for each block constituted by a group of memory cells. Accordingly, only the step-down circuit in the block including a selected memory cell is turned on, while the step-down circuits in the other blocks are kept in the OFF state. As a result, an unnecessary step-down operation can be avoided, which results in the reduction of power consumption.

According to the present invention, the variability of the step-down level in the bit line can be controlled irrespective of the operation conditions and device variability, and the occurrence of a malfunction in data reading and writing operations can be avoided.

The technology according to the present invention, which is capable of controlling the variability of the step-down level in the bit line irrespective of the operation conditions and device variability, and preventing any malfunction in data reading and writing operations, is particularly useful for a semiconductor storage device driven with a low voltage such as SRAM.

BRIEF DESCRIPTION OF THE DRAWINGS

These and other objects as well as advantages of the invention will become clear by the following description of preferred embodiments of the invention and be specified in the claimes attached hereto. A number of benefits not recited in this specification will come to the attention of the skilled in the art upon the implementation of the present invention.

FIG. 1 is a block diagram illustrating a constitution of a semiconductor storage device according to a preferred embodiment 1 of the present invention.

FIG. 3 is a timing chart illustrating an operation of the semiconductor storage device according to the preferred embodiment 1.

FIG. 6 is a circuit diagram illustrating a constitution of a step-down control circuit according to a preferred embodiment 3 of the present invention.

FIG. 7 is a circuit diagram illustrating a constitution of a step-down control circuit according to a preferred embodiment 4 of the present invention.

FIG. 8 is a circuit diagram illustrating a constitution of a step-down control circuit according to a preferred embodiment 5 of the present invention.

DETAILED DESCRIPTION OF THE INVENTION

Figure 2:
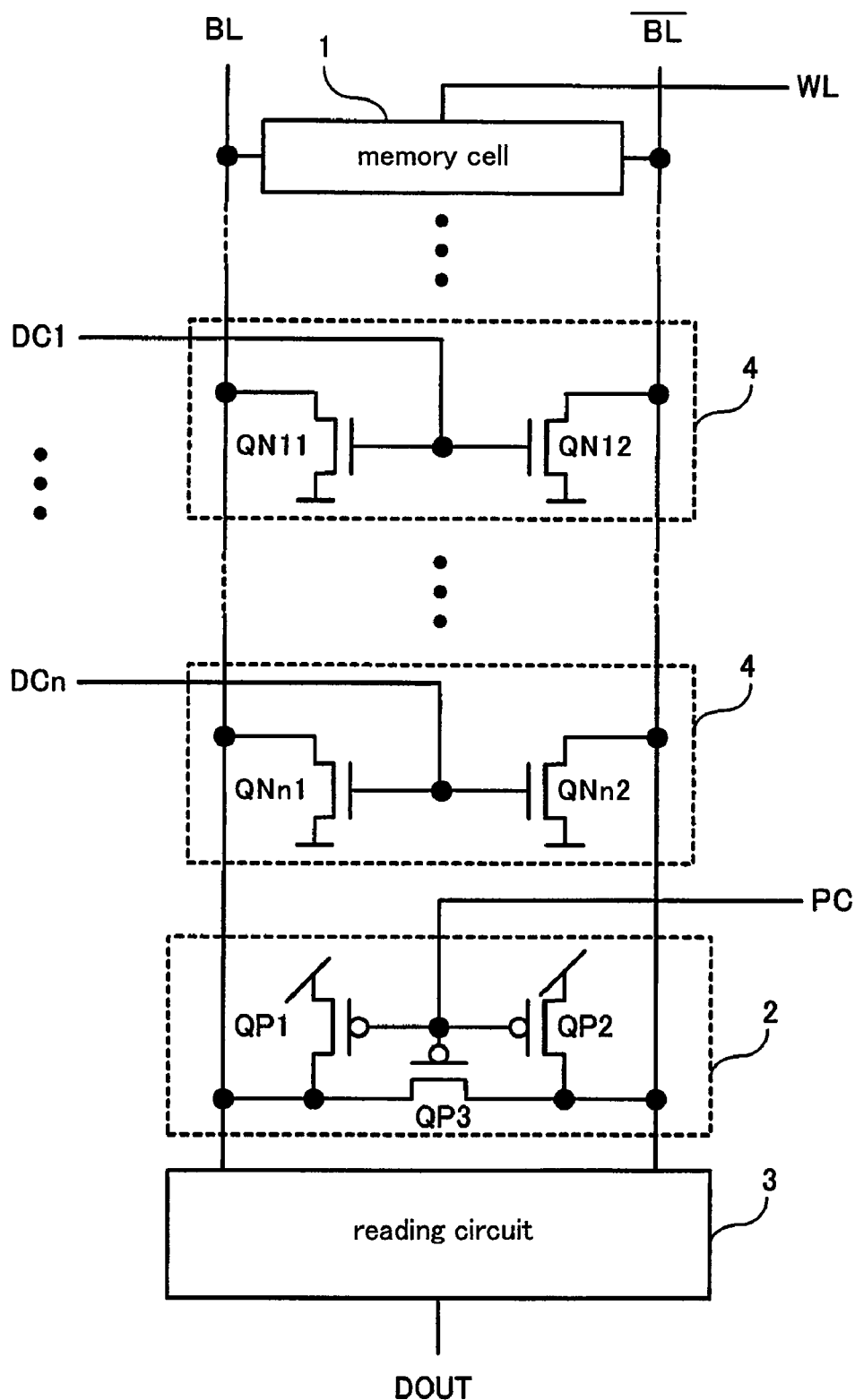
FIG. 2 is a circuit diagram illustrating the detailed constitution of the semiconductor storage device according to the preferred embodiment 1.

Hereinafter, preferred embodiments of a semiconductor storage device according to the present invention are described in detail referring to the drawings.

Preferred Embodiment 1

FIG. 1 is a block diagram illustrating a constitution of a semiconductor storage device according to a preferred embodiment 1 of the present invention. In the constitution according to the present preferred embodiment, complementary bit lines BL and /BL are connected to sources of a pair of access transistors in a memory cell 1 of SRAM activated when accessed via a word line WL. To the bit lines BL and /BL are connected a precharge circuit 2 having an equalizing function, a reading circuit 3 and a plurality of step-down circuits 4. The plurality of step-down circuits 4 are connected in parallel to each other.

FIG. 2 is a circuit diagram specifically illustrating the precharge circuit 2 and the step-down circuits 4 shown in FIG. 1. The precharge circuit 2 comprises precharge transistors QP1 and QP2 and an equalizing transistor QP3, which are PMOS transistors. A source and a drain of the equalizing transistor QP3 are connected to the bit lines BL and /BL, and a precharge control signal PC is applied to a gate thereof. A source of the precharge transistor QP1 is connected to a high-potential-side power supply, and a drain thereof is connected to the bit line BL. A source of the precharge transistor QP2 is connected to the high-potential-side power supply, and a drain thereof is connected to the bit line /BL. Gates of the precharge transistors QP1 and QP2 are connected to each other, and further connected to the gate of the equalizing transistor QP3.

Assume that the number of the provided plurality of step-down circuits 4 is n. The first step-down circuit 4 comprises step-down transistors QN11 and QN12 which are NMOS transistors. A source of the step-down transistor QN11 is connected to ground, and a drain thereof is connected to the bit line BL. A source of the step-down transistor QN12 is connected to the ground, and a drain thereof is connected to the bit line /BL. Gates of the step-down transistors QN11 and QN12 are connected to each other, and a step-down control signal DC1 is applied to these gates. The nth step-down circuit 4 comprises step-down transistors QNn11 and QNn2 which are NMOS transistors. A source of the step-down transistor QNn1 is connected to the ground, and a drain thereof is connected to the bit line BL. A source of the step-down transistor QNn2 is connected to the ground, and a drain thereof is connected to the bit line /BL. Gates of the step-down transistors QNn1 and QNn2 are connected to each other, and a step-down control signal DCn is applied to these gates. The other step-down circuits 4 are similarly constituted.

An operation of the semiconductor storage device thus constituted according to the present preferred embodiment is described referring to a timing chart illustrated in FIG. 3. At a timing t0, the low-active precharge control signal PC is in assert state, while the step-down control signals DC1-DCn are in negate state. Because the precharge control signal PC is at "L" level, the precharge transistors QP1 and QP2 and the equalizing transistor QP3 are in the ON state. Therefore, a power supply voltage VDD is applied to the bit lines BL and /BL, which are thereby precharged.

Prior to the activation of the word line WL (t4), when the precharge control signal PC is negated and thereby turns to "H" level at a timing t1, the precharge transistors QP1 and QP2 and the equalizing transistor QP3 are turned off, and the bit lines BL and /BL are disconnected from the power supply voltage VDD, which leaves the bit lines BL and /BL in a floating state.

When the plurality of step-down control signals DC1-DCn are asserted and thereby turn to "H" level at a timing t2, the step-down transistors QN11, QN12, . . . QNn1 and QNn2, which were so far in the OFF state, are turned on, and the voltages of the bit lines BL and /BL begin to be stepped down. Then, the potentials of the bit lines BL and /BL are stepped down to a predetermined voltage level (for example, VDD-Vth) along with a constant time constant.

When the plurality of step-down control signals DC1-DCn turn to "L" level at a timing t3, the step-down transistors QN11, QN12, . . . QNn1 and QNn2 are turned off and thereby disconnected from the ground. Then, the step-down operation for the bit lines BL and /BL is halted.

When the word line WL is activated and turns to "H" level at a timing t4, data is read from the memory cell 1. The reading operation is similar to that of the conventional technology.

When the word line WL turns to "L" level at a timing t5, the data reading operation is terminated. When the precharge control signal PC changes to "L" level at a timing t6, the precharge transistors QP1 and QP2 and the equalizing transistor QP3 are turned on, and the bit lines BL and /BL are precharged with the power supply voltage.

Figure 4:
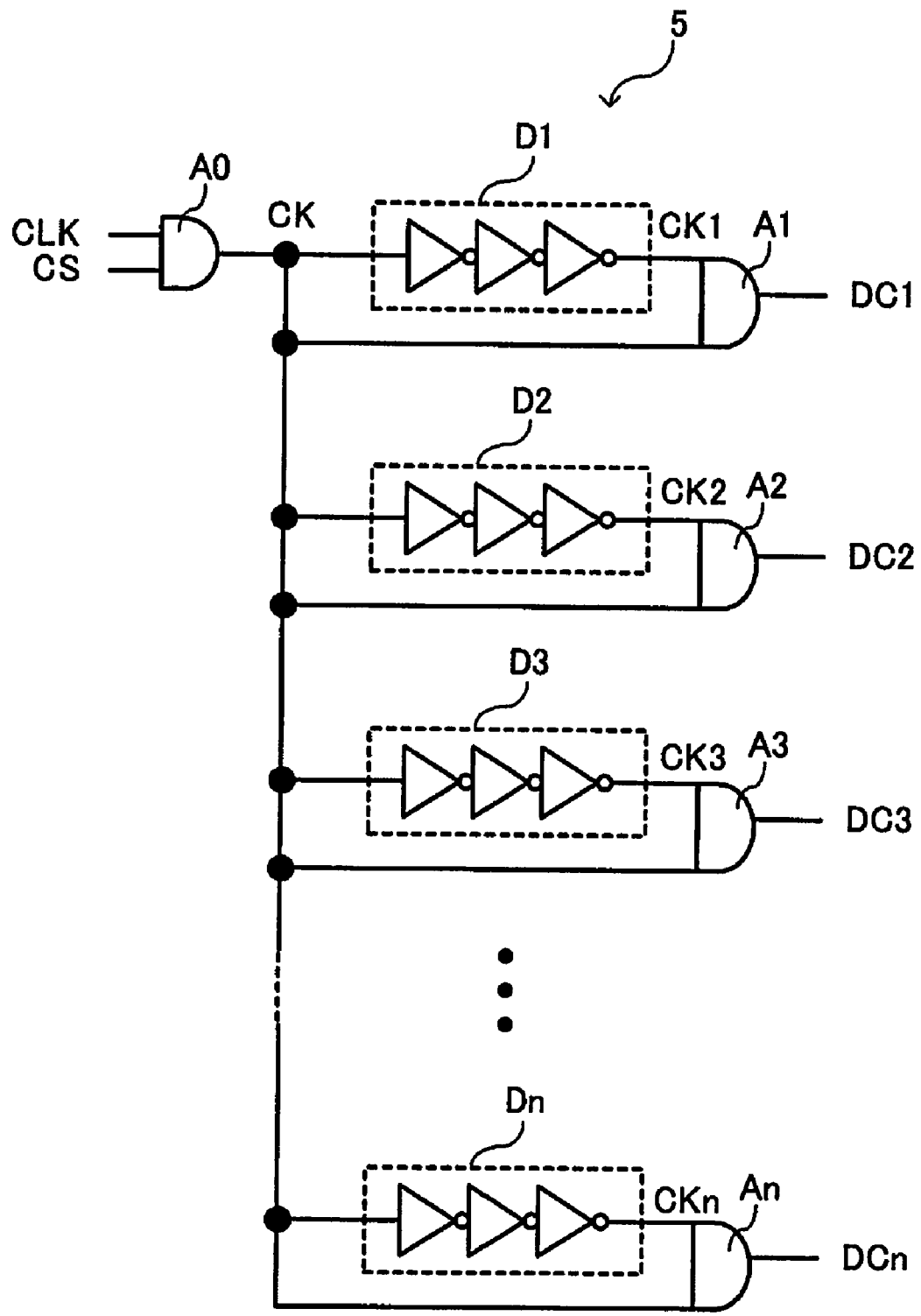
FIG. 4 is a circuit diagram illustrating a constitution of a step-down control circuit according to the preferred embodiment 1.

FIG. 4 is a circuit diagram illustrating a constitution of the step-down control circuit 5 which generates the step-down control signals DC1-DCn supplied to the plurality of step-down circuits 4 shown in FIG. 2. A0 denotes an AND gate which obtains the logical product of a clock CLK and a selection control signal CS and thereby generates a preliminary clock CK. Delay circuits D1-Dn are connected to an output terminal of the AND gate A0. An odd number of inverters constitute each of the delay circuits D1-Dn. The output terminal of the AND gate A0 and an output terminal of the delay circuit D1 are connected to an input terminal of an AND gate A1. The output terminal of the AND gate A0 and an output terminal of the delay circuit Dn are connected to an input terminal of an AND gate An. The other AND gates are similarly constituted.

The n number of delay circuits D1-Dn have the same circuit configuration. In the first delay circuit, the step-down control signal DC1 is outputted from the AND gate A1 based on the logical product of a delay inversion pulse CK1 obtained when the preliminary clock CK is delay-inverted in the delay circuit D1, and the preliminary clock CK. In the nth delay circuit, the step-down control signal DCn is outputted from the AND gate An based on the logical product of a delay inversion pulse CKn obtained when the preliminary clock CK is delay-inverted in the delay circuit Dn, and the preliminary clock CK. The other delay circuits are similarly constituted.

For comparison, below is described an assumed case where the n number of step-down circuits 4 are controlled in the same way by only the step-down control signal DC0 in place of the n number of step-down control signals DC1-DCn. In the description below, assume that a pulse width of the step-down control signal DC0 is T0, and a step-down voltage by the step-down control signal DC0 in one of the step-down circuits 4 is ΔV. ΔV is proportional to T0. The total of the step-down voltages in the n number of step-down circuits 4 is ΔV×n, which is proportional to T0. In the constitution for comparison based on these conditions, the total of the step-down voltages ΔV×n in the n number of step-down circuits 4 changes by k percentages if the pulse width T0 of the step-down control signal DC0 is shifted by k percentages. In other words, the variation of the pulse width directly reflects the variation of the step-down voltage.

On the other hand, in the case where the n number of step-down control signals DC1-DCn, which are different to one another, are generated and then number of step-down circuits 4 are individually controlled as in the present preferred embodiment, the changes in the n number of delay circuits D1-Dn resulting from the shift of the pulse width of the original preliminary clock CK by K percentages are not always the same. Because there are individual differences in the delay circuits D1-Dn, the changes generated in the respective delay circuits are as follows.

the change by $(k \pm \alpha_1)$ in the delay circuit D1,
the change by $(k \pm \alpha_2)$ in the delay circuit D2,
the change by $(k \pm \alpha_3)$ in the delay circuit D3,
the change by $(k \pm \alpha_4)$ in the delay circuit D4, and
the change by $(k \pm \alpha_n)$ in the delay circuit Dn In the delay circuits D1-Dn in which the individual differences are generated, the number of the delay circuits shifted to the plus side and the number of the delay circuits shifted to the minus side should, in general, become nearly equal. More specifically, the pulse width is increased in some of the n number of step-down control signals DC1-DCn, while the pulse width is reduced in the others. As a result, the n number of step-down circuits 4, which are connected in parallel to each other, are less affected, on the whole, by the shift of the pulse width of the original preliminary clock CK.

According to the present preferred embodiment wherein the plurality of step-down circuits 4 are controlled by the different step-down control signals DC1-DCn, therefore, the variability in the step-down levels of the bit lines BL and /BL can be controlled in comparison to the case where they are controlled by the single step-down control signal DC0. In the case where the transistors of the step-down circuits 4 have the same size, diffusion capacitances of the transistors, which are formed in the bit lines BL and /BL, can be made equal to each other. Further, in the case where a common drain is used, the diffusion capacitances formed in the bit lines BL and /BL can be reduced.

Preferred Embodiment 2

Figure 5:
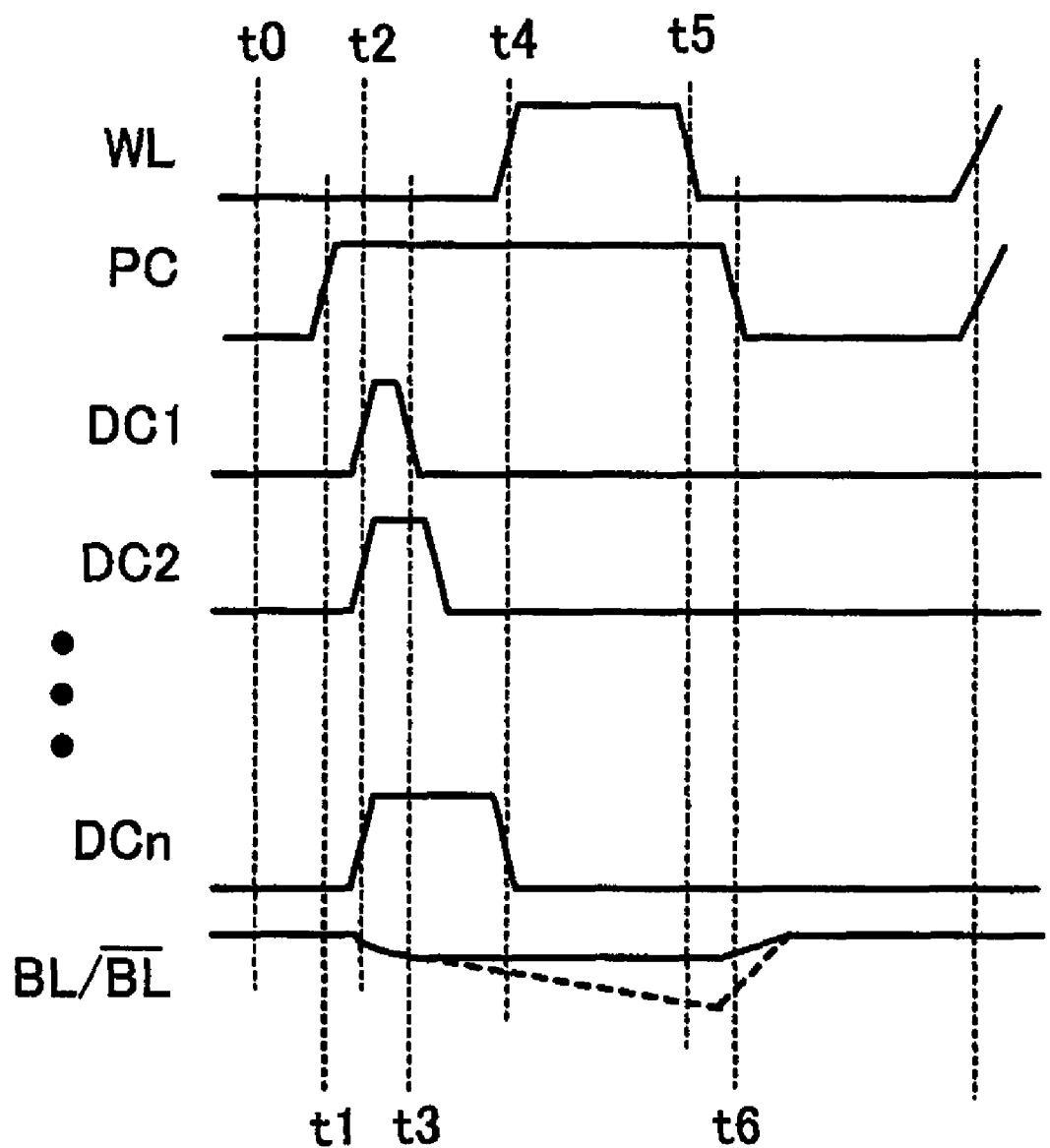
FIG. 5 is a timing chart illustrating an operation of a semiconductor storage device according to a preferred embodiment 2 of the present invention.

A semiconductor storage device according to a preferred embodiment 2 of the present invention is described referring to FIGS. 2, 4 and 5. FIG. 5 is a timing chart illustrating an operation of the semiconductor storage device according to the preferred embodiment 2. The n number of delay circuits D1-Dn, which are provided in the step-down control circuit 5 shown in FIG. 4, have different delay amounts. Accordingly, the n number of step-down control signals DC1-DCn respectively have different pulse widths, showing the diversification of delay circuits. The description of the rest of the constitution, which is similar to that of the preferred embodiment 1, is omitted.

An operation according to the present preferred embodiment is described below. It is assumed that the n numbr of step-down control signals DC1-DCn are asserted at almost the same timing. Because the n number of step-down circuits 4 are all under operating condition in an initial stage of the step-down operation, the step-down operation is performed at a high speed in the bit lines BL and /BL. Next, the first step-down control signal DC1 having the shortest pulse width is negated, and the operation of the corresponding step-down circuit 4 is halted. As a result, the number of the step-down circuits 4 which are under operating conditions is n−1, which slightly reduces the step-down speed in the bit lines BL and /BL. Then, step-down control signals DCi are negated one after another in increasing order of pulse width, and the number of the operating step-down circuits 4 is thereby reduced in such a manner as n−2, n−3, . . . . Then, the step-down operation is gradually slowed down in the bit lines BL and /BL.

In other words, the voltage levels of the bit lines BL and /BL speedily approach a targeted level in the initial stage, and thereafter slowly approach the targeted level. As a result, the step-down level is not largely shifted from the targeted level, which lessens the variability in the step-down levels of the bit lines. The description of the rest of the operation, which is similar to that of the preferred embodiment 1, is omitted.

Preferred Embodiment 3

A semiconductor storage device according to a preferred embodiment 3 of the present invention is described referring to FIGS. 2 and 6. FIG. 6 is a circuit diagram illustrating a constitution of a step-down control circuit 5 according to the preferred embodiment 3. A part of the n number of step-down control signals DC1-DCn are fixed to "L" level. In the example shown in the drawing, the ith-nth step-down control signals DCi-DCn are fixed to "L" level. In order to control the step-down control signals DC1-DCn thus constituted, one input in AND gates Ai-An is connected to the ground.

In the present preferred embodiment, the step-down control signals DC1-Dci−1, which are not fixed to "L" level, are used for the step-down operation for the bit lines BL and /BL performed according to the operation manner described in the preferred embodiment 1. According to the present preferred embodiment, when the step-down control signals, which are fixed to "L" level, are made adjustable based on a measurement result of TEG (Test Element Group) or the like, the step-down capacities can be adjusted.

Preferred Embodiment 4

A semiconductor storage device according to a preferred embodiment 4 of the present invention is described referring to FIGS. 2 and 7. FIG. 7 is a circuit diagram illustrating a constitution of a step-down control circuit 5 according to the preferred embodiment 4. Of first-nth AND gates A1-An, the ith-nth AND gates Ai-An are three-input AND gates, and a mode control signal MC is inputted to each of ith-nth AND gates Ai-An. When the mode control signal is kept at "L" level, the step-down control signals DCi-DCn outputted from the ith-nth AND gates Ai-An are constantly at "L" level. On the other hand, when the mode control signal is kept at "H" level, the step-down control signals DCi-DCn outputted from the ith-nth AND gates Ai-An constantly output the pulse signal as in the case of the preferred embodiment 1. Thus, in the present preferred embodiment, a part of the n number of step-down circuits 4 may be activated or inactivated when the mode control signal MC is switched between "H" and "L" levels, which means that the step-down level can be dynamically adjusted during the operation cycle. According to the present preferred embodiment thus constituted, in a low-voltage operation mode, for example, the mode control signal MC is set to "H" level and the number of the operating step-down circuits 4 is increased, and by doing so, a problem of an insufficient step-down level under a low voltage level can be resolved Preferred Embodiment 5

Figure 9:
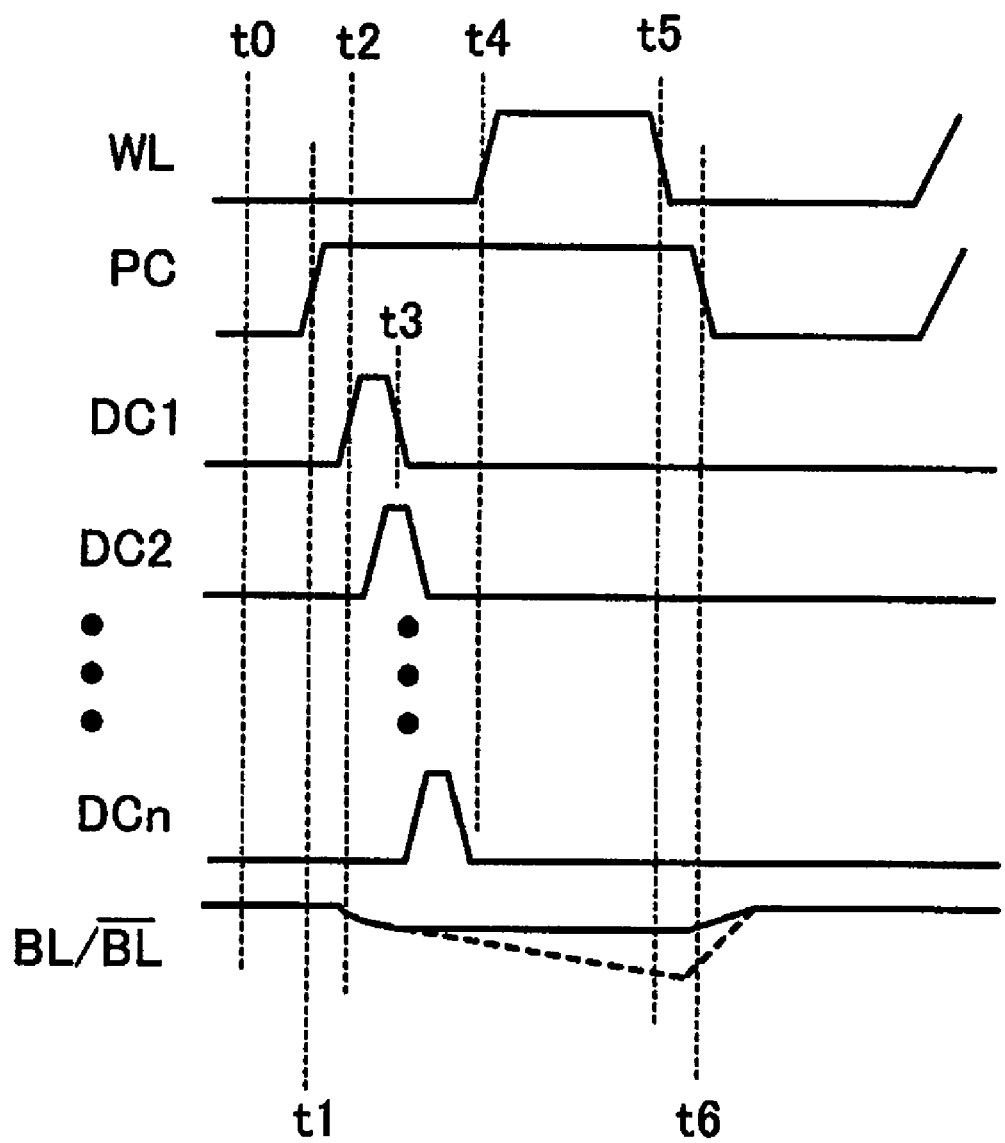
FIG. 9 is a timing chart illustrating an operation of a semiconductor storage device according to the preferred embodiment 5.

A semiconductor storage device according to a preferred embodiment 5 of the present invention is described referring to FIGS. 2, 8 and 9. FIG. 8 is a circuit diagram illustrating a constitution of a step-down control circuit 5 according to the preferred embodiment 5. The n number of delay circuits D1-Dn are serially connected. A second step-down control signal DC2 outputted from the second delay circuit D2 is a signal obtained by delaying the first step-down control signal DC1 by a certain period of time, a third step-down control signal DC3 outputted from the third delay circuit D3 is a signal obtained by delaying the second step-down control signal DC2 by a certain period of time, and a nth step-down control signal DCn outputted from the nth delay circuit Dn is a signal obtained by delaying a (n−1)th step-down control signal DCn−1 by a certain period of time. The n number of step-down control signals DC1-DCn are substantively equal to one another in pulse width and are different to one another in assert timing and negate timing.

FIG. 9 is a timing chart illustrating an operation of the semiconductor storage device according to the present preferred embodiment. The step-down operation for the bit lines BL and /BL is similar to that of the preferred embodiment 1. According to the present preferred embodiment, the number of the step-down circuits 4 which are simultaneously operating can be adjusted when the operating timings of the plurality of step-down circuits 4 are shifted from one another. Accordingly, a drastic voltage drop resulting from the step-down operation can be controlled.

Preferred Embodiment 6

Figure 10:
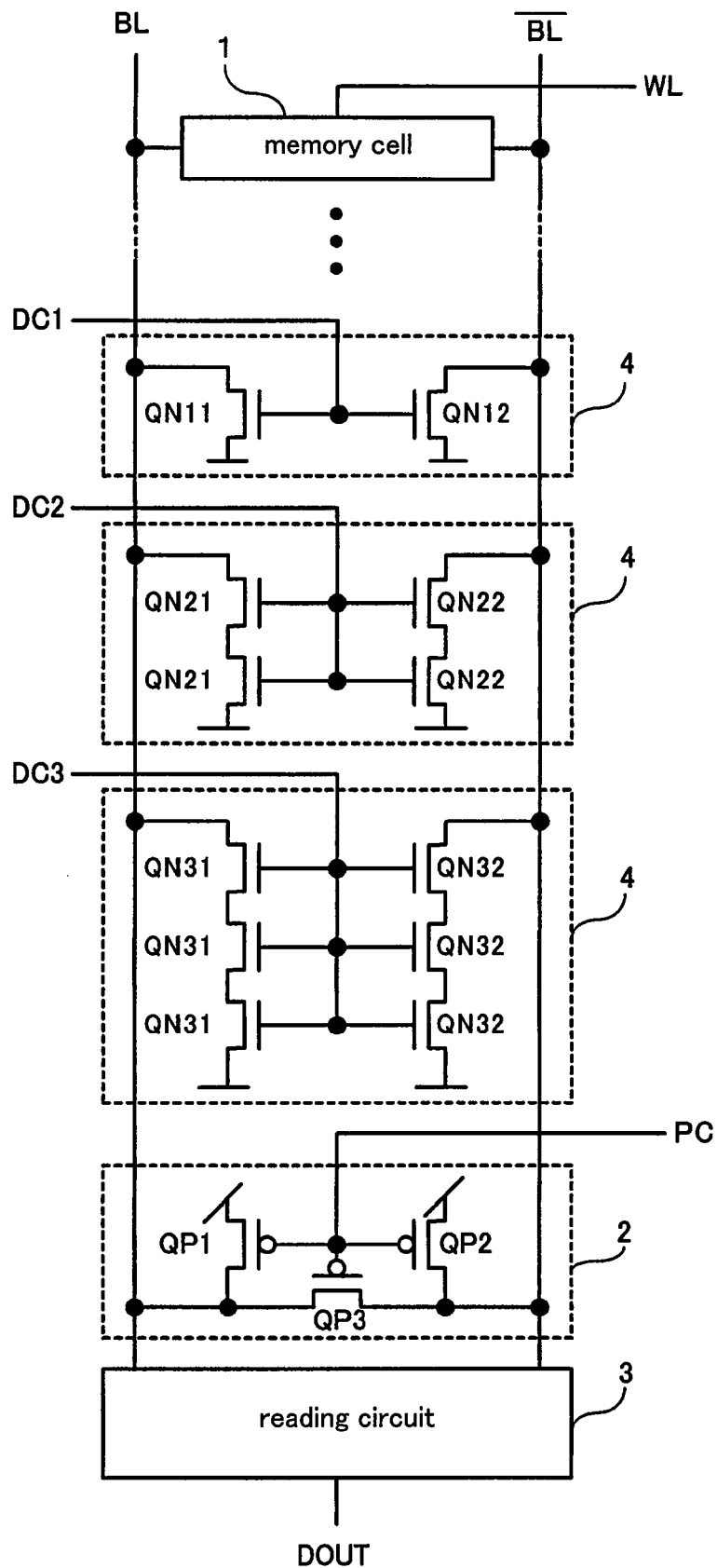
FIG. 10 is a block diagram illustrating a constitution of a semiconductor storage device according to a preferred embodiment 6 of the present invention.

FIG. 10 is a circuit diagram illustrating a semiconductor storage device according to a preferred embodiment 6 of the present invention. The semiconductor storage device according to the present preferred embodiment comprises a plurality of step-down circuits 4 (three in FIG. 10). Each of the step-down circuits 4 comprises a pair of a step-down transistor QN1 on the bit-line-BL side and a step-down transistor QN12 on the bit-line-/BL side or a plurality of pairs of these transistors. The plurality of pairs of step-down transistors are each serially connected to each other. A pair of step-down transistors is provided in the first step-down circuit 4, two pairs of step-down transistors are serially provided in the second step-down circuit 4, and three pairs of step-down transistors are serially provided in the third step-down circuit 4. The rest of the components, which are the same as those shown in FIG. 2 according to the preferred embodiment 1, are simply provided with the same reference symbols, and are not described again. The step-down control for the bit lines BL and /BL is similar to that of the preferred embodiment 1.

Provided that the step-down capacity of the first step-down circuit 4 is P, the step-down capacity of the second step-down circuit 4 is ½ P, the step-down capacity of the third step-down circuit 4 is ⅓ P, and the overall step-down capacity is 1.83 P. In the present preferred embodiment, the plurality of step-down circuits, in which the step-down capacities can vary depending on the number of the step-down transistors serially provided, are used. Accordingly, the step-down level for the bit line can be more finely adjusted with a higher accuracy. In other words, the variability described earlier can be more effectively and accurately alleviated.

In place of changing the number of the step-down transistors serially provided in the respective step-down circuits, gate widths, gate lengths, threshold values and substrate bias voltages of the respective transistors may be changed. In either case, the step-down capacities are made adjustable in the respective step-down circuits, and consequently the variability described earlier can be more effectively and accurately alleviated.

Preferred Embodiment 7

Figure 11:
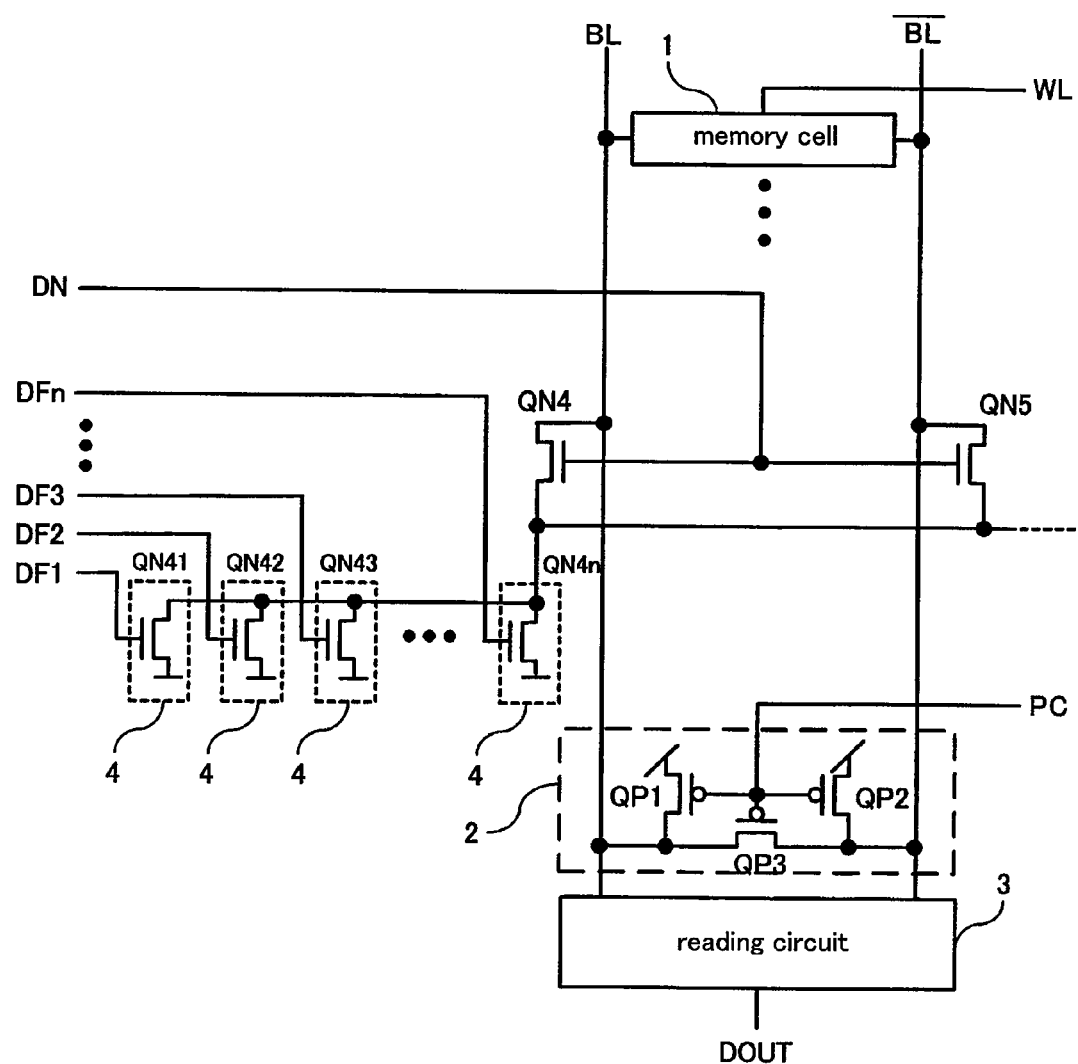
FIG. 11 is a block diagram illustrating a constitution of a semiconductor storage device according to a preferred embodiment 7 of the present invention.
Figure 12:
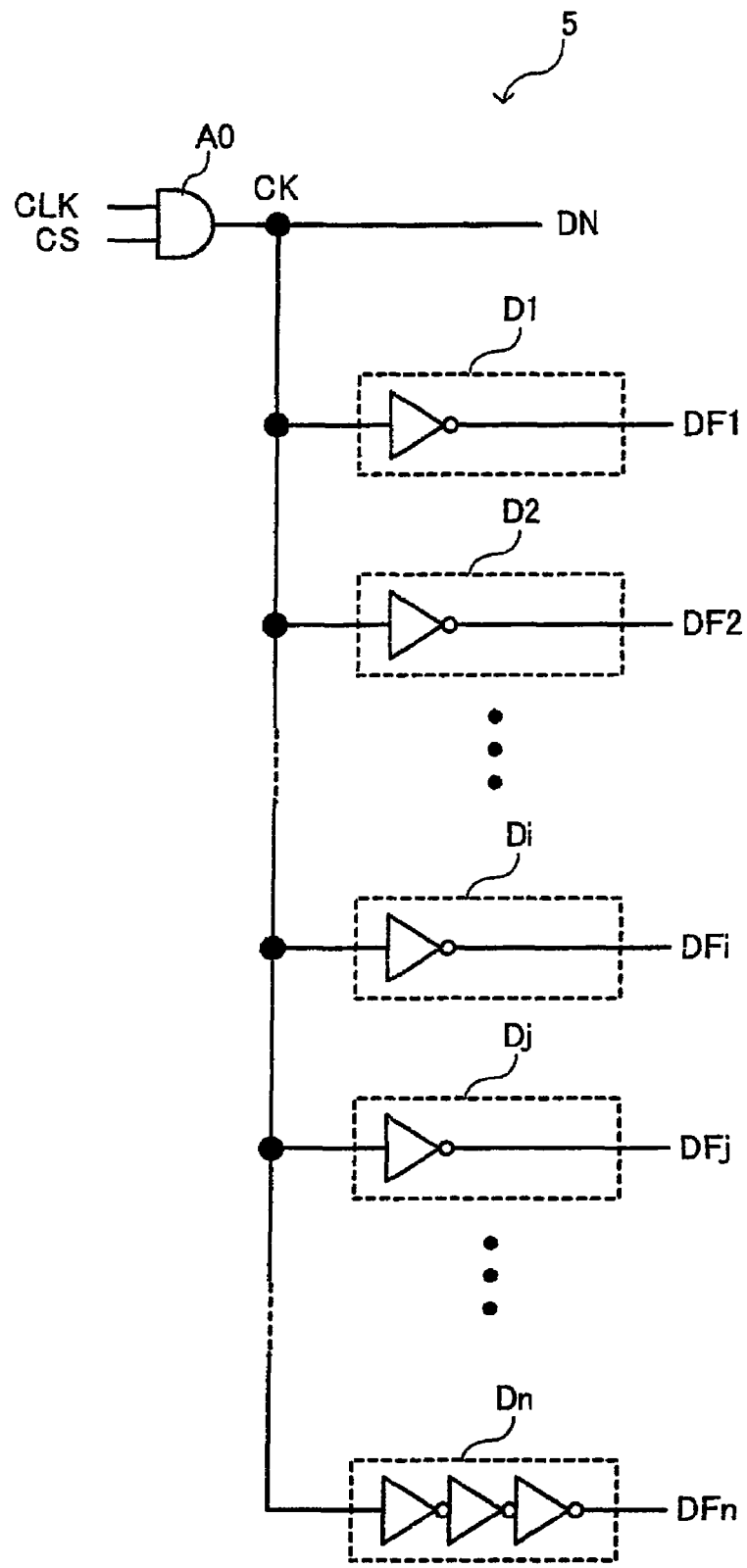
FIG. 12 is a circuit diagram illustrating a constitution of a step-down control circuit according to the preferred embodiment 7.
Figure 13:
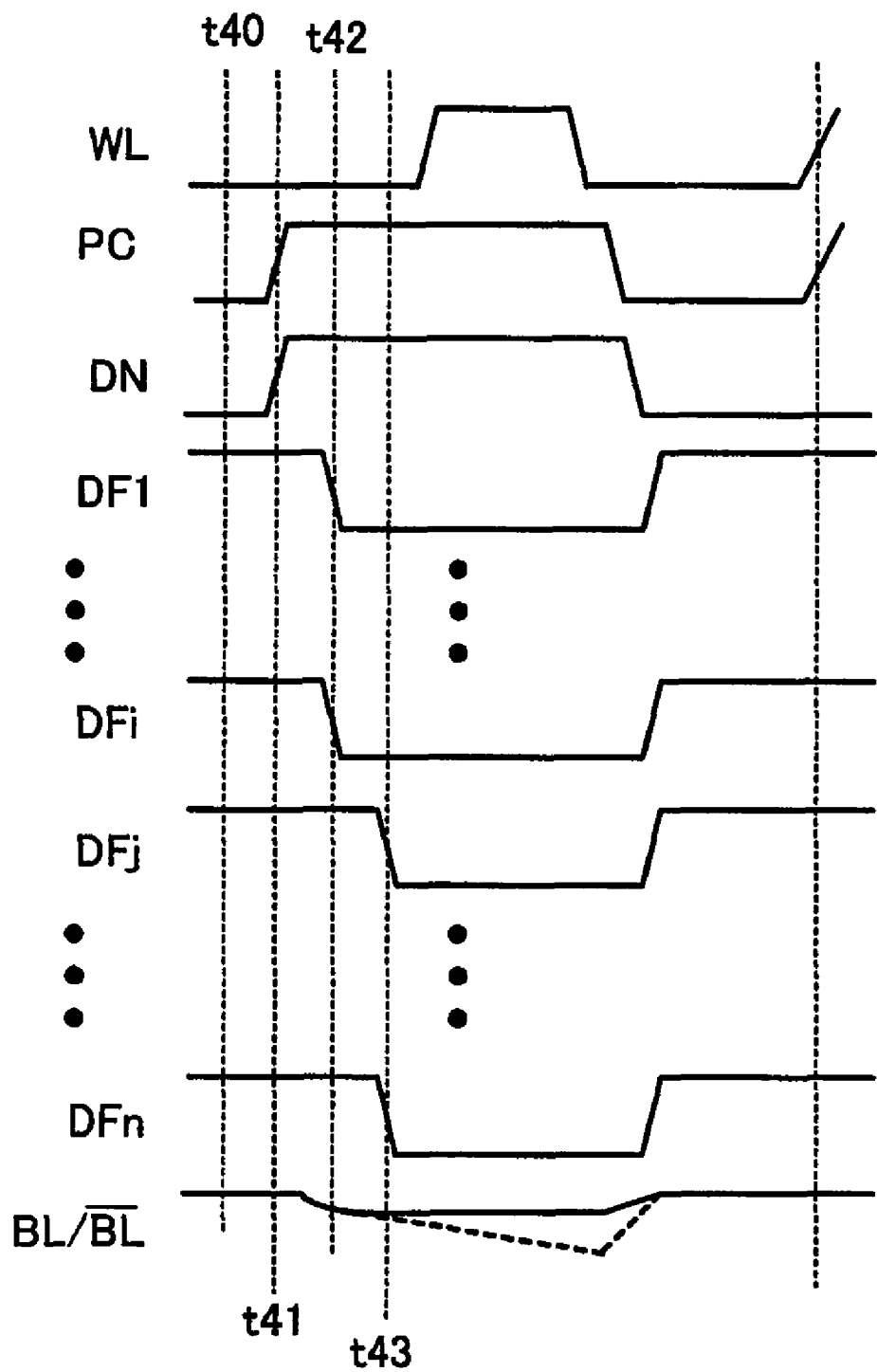
FIG. 13 is a timing chart illustrating an operation of the semiconductor storage device according to the preferred embodiment 7.

A semiconductor storage device according to a preferred embodiment 7 of the present invention is described referring to FIGS. 11, 12 and 13. FIG. 11 is a circuit diagram illustrating a constitution of the semiconductor storage device according to the preferred embodiment 7. The n number of step-down circuits 4 are connected to the bit line BL via a switching transistor QN4, and further connected to the bit line /BL via a switching transistor QN5. An NMOS transistor constitutes each of the N number of step-down circuits 4. More specifically, a step-down transistor QN41 constitutes the first step-down circuit 4, a step-down transistor QN42 constitutes the second step-down circuit 4, and a step-down transistor QN4n constitutes the nth step-down circuit 4. In the n number of step-down transistors QN41-QN4n, their drains are connected to one another, their sources are connected to the ground, and step-down control signals DF1-DFn are supplied to each of their gates. The n number of step-down transistors QN41-QN4n connected in parallel are connected to the bit line BL via the switching transistor QN4. A drain of the switching transistor QN4 is connected to the bit line BL, a source thereof is connected to the drains of the step-down transistors QN41-QN4n connected in parallel, and a step-down start control signal DN is supplied to a gate thereof. The n number of step-down circuits 4 are also connected to the bit line /BL via the switching transistor QN5. A memory cell 1, a precharge circuit 2 and a reading circuit 3 according to the present preferred embodiment are constituted in a manner similar to those recited in the preferred embodiment 1.

FIG. 12 is a circuit diagram illustrating a constitution of a step-down control circuit 5 according to the preferred embodiment 7. The step-down start control signal DN is outputted from an output terminal of an AND gate A0. The n number of delay circuits D1-Dn are connected to the output terminal of the AND gate A0, and step-down control signals DF1-DFn are outputted from the output terminals of the delay circuits D1-Dn. Delay amounts in some of the delay circuits D1-Dn are relatively small, while delay amounts in the others are relatively large. The delay circuits in which the delay amount is small are called D1-Di, while the delay circuits in which the delay amount is large are called Dj-Dn.

An operation of the semiconductor storage device thus constituted according to the present preferred embodiment is described referring to a timing chart illustrated in FIG. 13. At a timing t40, the low-active precharge control signal is in assert state, the step-down start control signal DN is in negate state, and the n number of step-down control signals DF1-DFn are in assert state. The n number of step-down transistors QN41-QN4n in the step-down circuits 4 are in the ON state because of "H" level of the step-down control signals DF1-DFn. However, the step-down start control signal DN is at "L" level, and the switching transistor QN4 is thereby in the OFF state. Therefore, the bit lines BL and /BL are being precharged with the power supply voltage VDD via the precharge transistors QP1 and QP2 in the ON state.

At a timing t41, the precharge control signal PC turns to "H" level, and the step-down start control signal DN turns to "H" level. As a result, the precharge transistors QP1 and QP2 and the equalizing transistor QP3 are turned off, which leaves the bit lines BL and /BL in a floating state. Further, the switching transistors QN4 and QN5 are turned on, the step-down operation for the bit lines BL and /BL starts. Charges in the bit line BL are released to the ground via the switching transistor QN4 and the step-down transistor QN41-QN4n (connected in parallel) in the ON state.

At a timing t42, the step-down control signals DF1-DFi turn to "L" level, and the step-down transistors QN41-QN4i are turned off. However, the step-down transistors QNj-QN4n are still in ON state. Accordingly, the speed of the step-down operation is reduced since the number of the step-down transistors in the ON state is lessened.

At a timing t43, the step-down control signals DFj-DFn turn to "L" level, and the step-down transistors QNj-QN4n are thereby turned off, which leaves all of the step-down transistors QN41-QN4n in the OFF state. Then, the step-down operation for the bit lines BL and /BL is halted, and the bit lines BL and /BL are stepped down to a predetermined voltage level. The description of the operation thereafter, which is similar to the operation described earlier, is omitted.

In the present preferred embodiment, the n number of step-down circuits 4 (step-down transistors QN41-QN4n) are connected to the bit lines BL and /BL via the switching transistors QN4 and QN5. Only the switching transistor Qn4 is directly connected to the bit line BL, and only the switching transistor Qn5 is directly connected to the bit line /BL. In the preferred embodiment 1, the n number of step-down transistors QN11-QNn1 are directly connected to the bit line BL, and the n number of step-down transistors QN12-QNn2 are directly connected to the bit line /BL. In the preferred embodiment 1, therefore, the diffusion capacitances of the transistors connected to the bit lines BL and /BL are increased, which adversely affect the increase of the operation speed. In the present preferred embodiment, however, only the switching transistor Qn4 is directly connected to the bit line BL, and only the switching transistor Qn5 is directly connected to the bit line /BL. As a result, the diffusion capacitances of the transistors connected to the bit lines BL and /BL are lessened, and the reduction of the operation speed can be prevented.

Further, the step-down control signals DC1-DCn are the pulse signals in which the pulse width is small as shown in FIG. 3 in the preferred embodiment 1. In the present preferred embodiment wherein the step-down circuits 4 are turned on and off by the combination of the step-down start control signal DN and the step-down control signals DF1-DFn, the pulse widths of the step-down control signals DF1-DFn may be large. When a pulse signal having a small pulse width is transmitted in a low-voltage state, the pulse is possibly crushed. In the present preferred embodiment wherein the pulse signal whose pulse width is large can be adopted, the risk that the pulse may be crushed when the pulse signal is transmitted in the low-voltage state can be avoided.

Preferred Embodiment 8

Figure 14:
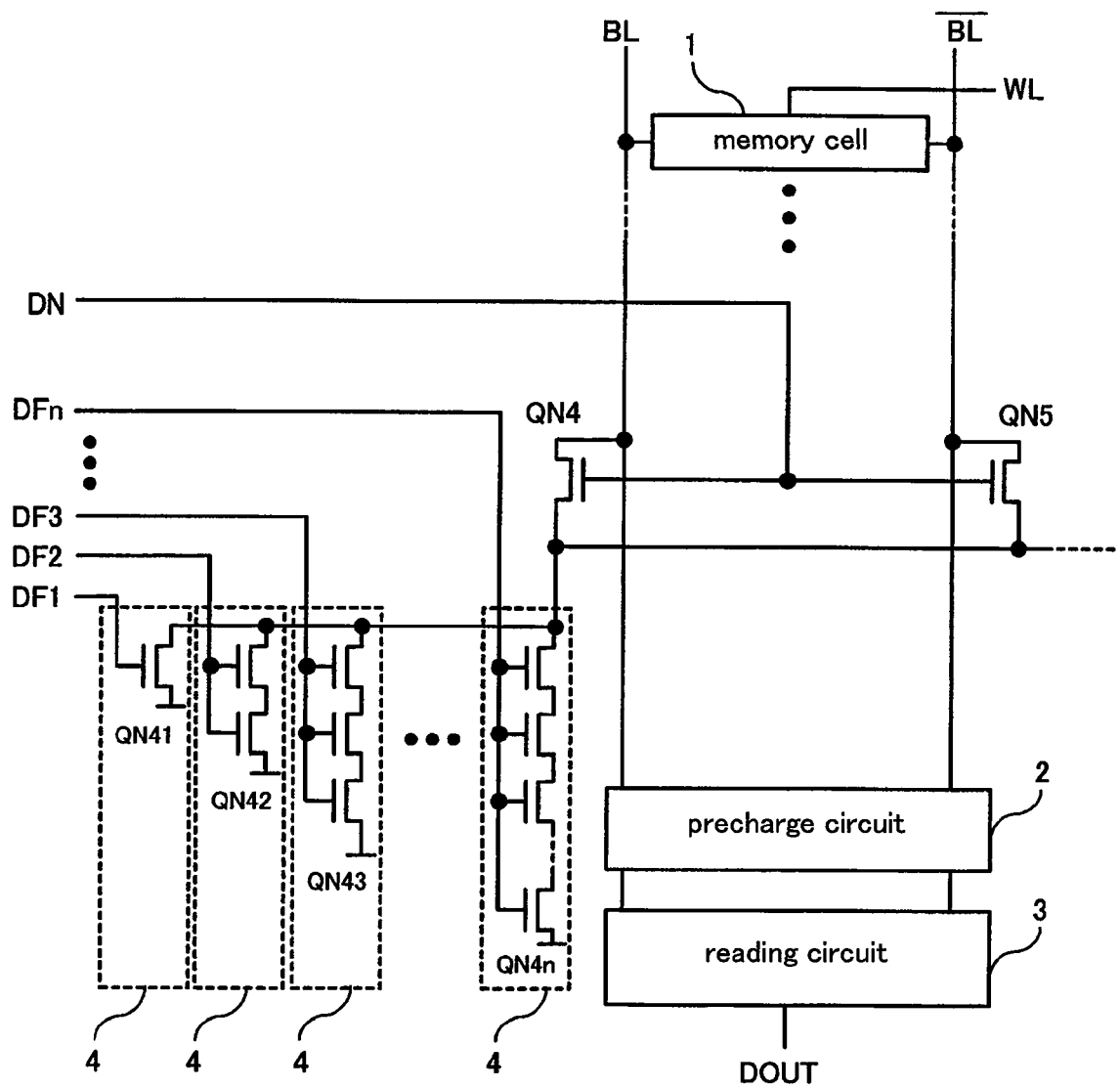
FIG. 14 is a block diagram illustrating a constitution of a semiconductor storage device according to a preferred embodiment 8 of the present invention.
Figure 15A:
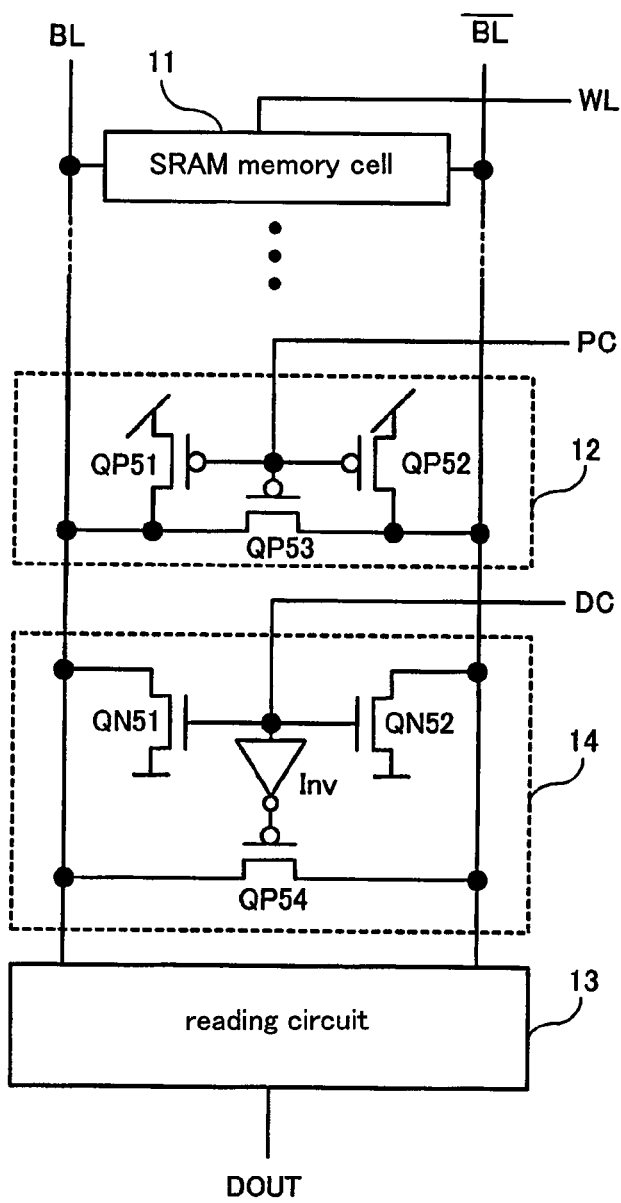
FIG. 15A is a circuit diagram illustrating a constitution of a semiconductor storage device according to a conventional technology.
Figure 15B:
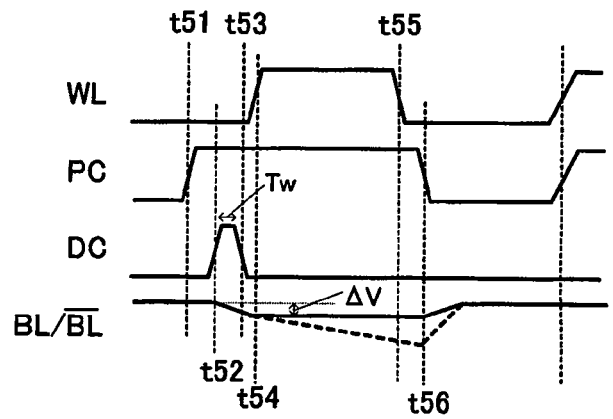
FIG. 15B is a timing chart illustrating an operation of the conventional technology.

FIG. 14 is a circuit diagram illustrating a constitution of a semiconductor storage device according to a preferred embodiment 8 of the present invention. A first step-down circuit 4 comprises a step-down transistor QN41, a second step-down circuit 4 comprises two step-down transistors QN42 serially connected to each other, and a third step-down circuit 4 comprises three step-down transistors QN43 serially connected to one another. An nth step-down circuit 4 comprises n number of step-down transistors QN4n serially connected to one another. The rest of the components, which are the same as those shown in FIG. 11 according to the preferred embodiment 7, are simply provided with the same reference symbols, and are not described again. The step-down operation for the bit lines BL and /BL is similar to that of the preferred embodiment 1.

According to the present preferred embodiment, the number of the step-down transistors serially connected to each other is changed in the n number of step-down circuits 4 so that the step-down capacities thereof can vary. As a result, the variability described earlier can be more effectively and accurately reduced.

In place of changing the number of the step-down transistors serially provided in the respective step-down circuits, gate widths, gate lengths, threshold values and substrate bias voltages of the respective transistors may be changed. In either case, the step-down capacities are made adjustable, and the variability described earlier can be more effectively and accurately alleviated.

Preferred Embodiment 9

In a semiconductor storage device according to a preferred embodiment 9 of the present invention, a plurality of step-down circuits 4 are also connected to other bit lines BL and /BL, not shown, as implied by a dotted line extending from sources of switching transistors QN4 and QN5 in the semiconductor storage device illustrated in FIGS. 11 and 14. Accordingly, an area reduction can be realized.

Preferred Embodiment 10

In a preferred embodiment 10 of the present invention, a plurality of step-down circuits are equally spaced when provided in the bit lines in the case where the step-down circuits are controlled by the same control signal or control signals having the same timing. As a result, the variability of the step-down level caused depending on the positions of the step-down circuits in the bit lines can be alleviated.

Preferred Embodiment 11

In a preferred embodiment 11 of the present invention, a plurality of bit lines are provided in parallel with each other and constitute a plurality of groups of bit lines which are separate from each other (group of right-side bit lines, group of central bit lines, and group of left-side bit lines). In the case where a plurality of step-down circuits are controlled by the same control signal or control signals having the same timing in this constitution, these step-down circuits are provided separately in each of the group of right-side bit lines, group of central bit lines, and group of left-side bit lines, and then connected to bit lines constituting the corresponding group of bit lines. As a result, the variability of the step-down level caused depending on the positions of the step-down circuits in the bit lines can be alleviated.

Preferred Embodiment 12

A plurality of the memory cells on the same bit line are divided into blocks, and a step-down circuit is provided for each of the blocks. Then, only the step-down circuit in the block which includes a selected memory cell is turned on. Accordingly, an unnecessary step-down operation can be avoided, which results in the reduction of power consumption.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A semiconductor storage device comprising:
   a memory cell;
   a bit line connected to the memory cell;
   a precharge circuit for stepping up a voltage of the bit line to a power supply voltage; and
   a plurality of step-down circuits for stepping down the voltage of the bit line to a voltage level lower than the power supply voltage before data is read from the memory cell, wherein
   the plurality of step-down circuits are connected to the bit line, and the plurality of step-down circuits are controlled by step-down control signals different to each other.

2. The semiconductor storage device as claimed in claim 1, wherein
   first NMOS transistors constitute the plurality of step-down circuits, and a step-down control signal is supplied to gates of the first NMOS transistors, sources thereof are connected to ground, and drains thereof are connected to the bit line.

3. The semiconductor storage device as claimed in claim 1, wherein
   pulse widths of at least a part of the plurality of step-down control signals are different to each other.

4. The semiconductor storage device as claimed in claim 1, wherein
   at least a part of the plurality of step-down control signals can be fixed in an inactive state.

5. The semiconductor storage device as claimed in claim 1, wherein
   at least a part of the plurality of step-down control signals are switched between an active state and an inactive state by a mode control signal.

6. The semiconductor storage device as claimed in claim 1, wherein
   pulse width are substantively equal to each other and assert and negate timings are different in the plurality of step-down control signals.

7. The semiconductor storage device as claimed in claim 1, wherein
   the plurality of step-down circuits are connected to the bit line via a switching element whose on and off is controlled by a step-down start control signal.

8. The semiconductor storage device as claimed in claim 7, wherein
   second NMOS transistors constitute the plurality of step-down circuits, and a step-down control signal is supplied to gates of the second NMOS transistors, sources thereof are connected to ground, and drains thereof are connected to a step-down control power supply,
   a third NMOS transistor constitutes the switching element, and
   a step-down start control signal is supplied to a gate of the third NMOS transistor, a source thereof is connected to the step-down control power supply, and a drain thereof is connected to the bit line.

9. The semiconductor storage device as claimed in claim 7, wherein
   the plurality of step-down circuits are shared by a plurality of bit lines.

10. The semiconductor storage device as claimed in claim 1, wherein
    at least two of the plurality of step-down circuits have a step-down capacity which is different to step-down capacities of the other step-down circuits.

11. The semiconductor storage device as claimed in claim 10, wherein
    fourth NMOS transistors whose gates are supplied with a step-down control signal constitute at least two of the plurality of step-down circuits, and the fourth NMOS transistors are serially connected to each other between the bit line and ground.

12. A semiconductor storage device comprising:
    a plurality of memory cells;
    a bit line to which the plurality of memory cells are connected;
    a precharge circuit for stepping up a voltage of the bit line to a power supply voltage; and
    a plurality of step-down circuits for stepping down the voltage of the bit line to a voltage level lower than the power supply voltage before data is read from any of the plurality of memory cells, wherein
    the plurality of step-down circuits are connected to the bit line, and the plurality of step-down circuits are equally spaced and then connected to the bit line.

13. The semiconductor storage device as claimed in claim 12, wherein
    a step-down control signal is supplied to gates of the plurality of step-down circuits, sources thereof are connected to ground, and drains thereof are connected to the bit line.

14. The semiconductor storage device as claimed in claim 12, wherein
    a plurality of bit lines are provided in parallel with each other and constitute a plurality of groups of bit lines provided separately from each other, and
    the plurality of step-down circuits are provided in the respective groups of the bit lines and connected to the bit line constituting the corresponding group of bit lines.

15. The semiconductor storage device as claimed in claim 1, wherein
    the plurality of step-down circuits are provided for each block constituted by the group of memory cells.

16. The semiconductor storage device as claimed in claim 12, wherein
    the plurality of step-down circuits are provided for each block constituted by the group of memory cells.

* * * * *